United States Patent
Barr et al.

(10) Patent No.: US 11,809,441 B2
(45) Date of Patent: Nov. 7, 2023

(54) WAFER-LEVEL PACKAGE ASSEMBLY HANDLING

(71) Applicant: Onto Innovation, Inc., Wilmington, DE (US)

(72) Inventors: Kevin Barr, Bloomington, MN (US); Edward Andrew Condon, Sandown, NH (US)

(73) Assignee: Onto Innovation Inc., Wilmington, MA (US)

( * ) Notice: Subject to any disclaimer, the term of this patent is extended or adjusted under 35 U.S.C. 154(b) by 629 days.

(21) Appl. No.: 16/651,870

(22) PCT Filed: Sep. 28, 2018

(86) PCT No.: PCT/US2018/053300
§ 371 (c)(1),
(2) Date: Mar. 27, 2020

(87) PCT Pub. No.: WO2019/067834
PCT Pub. Date: Apr. 4, 2019

(65) Prior Publication Data
US 2020/0257699 A1 Aug. 13, 2020
US 2022/0012261 A2 Jan. 13, 2022
US 2022/0121676 A2 Apr. 21, 2022

Related U.S. Application Data

(60) Provisional application No. 62/564,400, filed on Sep. 28, 2017.

(51) Int. Cl.
| G06F 16/25 | (2019.01) |
| G06F 16/26 | (2019.01) |
| G06F 16/176 | (2019.01) |
| G06F 16/28 | (2019.01) |
| H01L 21/683 | (2006.01) |

(Continued)

(52) U.S. Cl.
CPC ......... *G06F 16/258* (2019.01); *G06F 16/176* (2019.01); *G06F 16/26* (2019.01); *G06F 16/288* (2019.01); *H01L 21/683* (2013.01); *H01L 21/68714* (2013.01); *H01L 21/68728* (2013.01); *H01L 22/30* (2013.01)

(58) Field of Classification Search
CPC .................................................. H01L 21/683
See application file for complete search history.

(56) References Cited

U.S. PATENT DOCUMENTS

| 3,705,769 A | 12/1972 | Johannsmeier |
| 4,746,256 A | 5/1988 | Boyle et al. |

(Continued)

FOREIGN PATENT DOCUMENTS

| CN | 1481577 A | 3/2004 |
| CN | 111357097 | 6/2020 |

(Continued)

OTHER PUBLICATIONS

"International Application Serial No. PCT US2018 053300, Written Opinion dated Dec. 11, 2018", 6 pgs.

(Continued)

*Primary Examiner* — Mounir S Amer
(74) *Attorney, Agent, or Firm* — Schwegman Lundberg & Woessner, P.A.

(57) ABSTRACT

A chuck assembly includes an upper surface configured to support a wafer-level package assembly and a clamping mechanism securing the wafer-level package assembly to the upper surface.

19 Claims, 4 Drawing Sheets

(51) Int. Cl.
*H01L 21/687* (2006.01)
*H01L 21/66* (2006.01)

(56) References Cited

U.S. PATENT DOCUMENTS

| | | |
|---|---|---|
| 6,307,390 B1 | 10/2001 | Akaike et al. |
| 6,580,283 B1 | 6/2003 | Carbone et al. |
| 6,706,618 B2 | 3/2004 | Takisawa et al. |
| 10,468,288 B2 | 11/2019 | Balan et al. |
| 2002/0153676 A1 | 10/2002 | Noguchi |
| 2004/0025322 A1 | 2/2004 | Binnard |
| 2010/0166292 A1 | 7/2010 | Harless et al. |
| 2013/0330154 A1 | 12/2013 | Sowden et al. |
| 2021/0183684 A1 | 6/2021 | Labrie et al. |

FOREIGN PATENT DOCUMENTS

| | | |
|---|---|---|
| JP | H1092850 A | 4/1998 |
| JP | 2004128202 A | 4/2004 |
| TW | 201243991 | 11/2012 |
| TW | 201923932 | 6/2019 |
| WO | WO-9967812 A1 | 12/1999 |
| WO | 2017054146 A1 | 4/2017 |
| WO | 2019067834 | 4/2019 |

OTHER PUBLICATIONS

"International Application Serial No. PCT US2018 053300, International Preliminary Report on Patentability dated Apr. 9, 2020", 8 pgs.

"Taiwanese Application Serial No. 107134104, Office Action dated Sep. 2, 2021", with machine English translation, 23 pages.

"Taiwanese Application Serial No. 107134104, Response filed Nov. 30, 2021 to Office Action dated Sep. 2, 2021", with English claims, 30 pages.

"International Search Report", PCT Application No. PCT/US2018/53300, dated Dec. 11, 2018, 2 pages.

"Chinese Application Serial No. 201880074474.7, Office Action dated Mar. 1, 2023", w/ English Translation, 15 pgs.

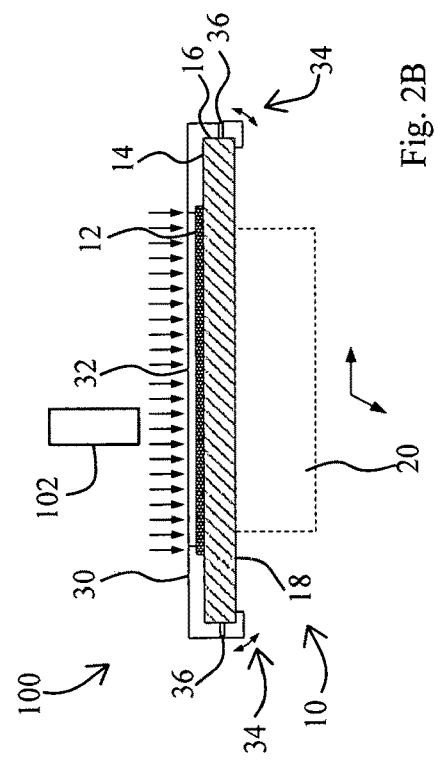
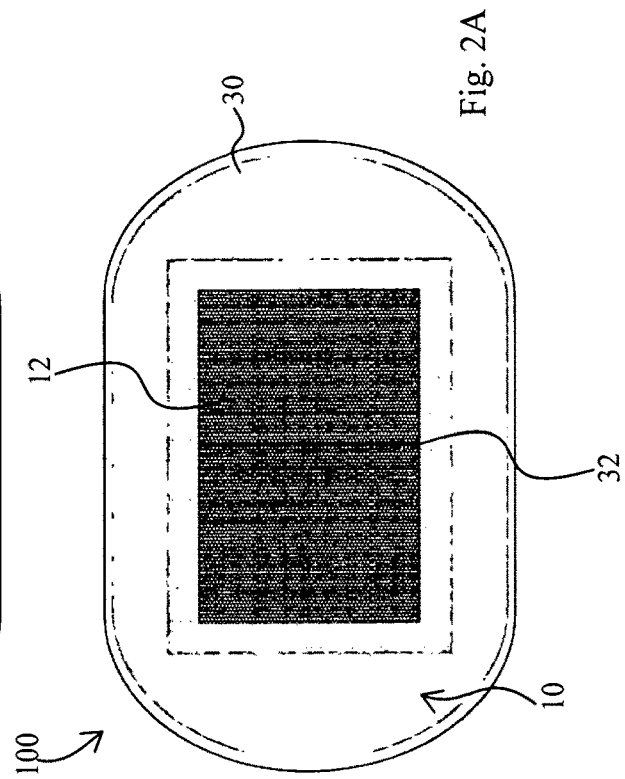
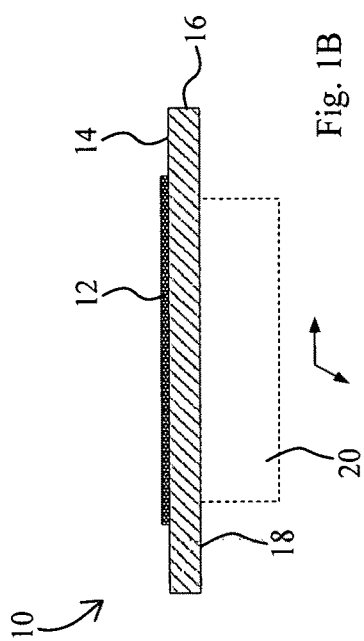
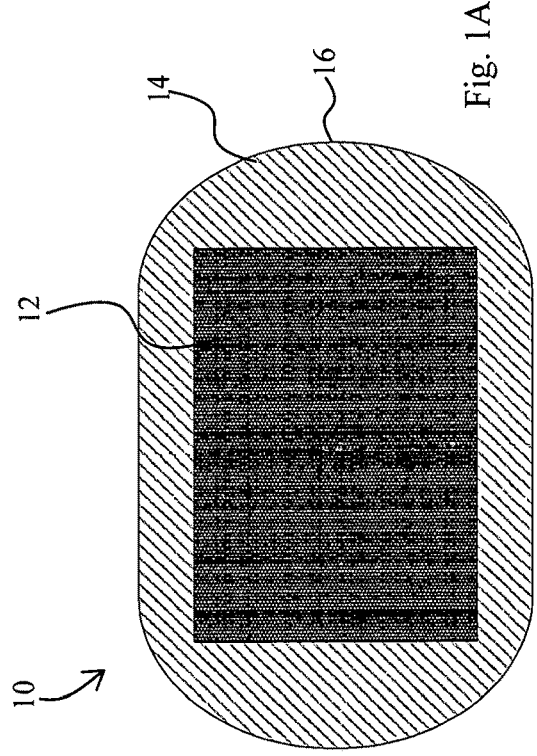

WAFER-LEVEL PACKAGE ASSEMBLY HANDLING

BACKGROUND

Wafer-level package assemblies can be formed in various shapes and sizes, making handling of wafer-level package assemblies difficult when inspecting and providing various processing tasks such as inspecting and depositing redistribution layers.

BRIEF DESCRIPTION OF THE DRAWINGS

FIG. 1A is a schematic top plan view of a chuck assembly supporting a wafer-level package assembly.

FIG. 1B is a schematic side view of the chuck assembly of FIG. 1A.

FIG. 2A is a top plan view of a material handling system supporting a wafer-level package assembly with a clamping mechanism securing the wafer-level package assembly to the chuck assembly.

FIG. 2B is a schematic side view of the material handling system of FIG. 2A.

DESCRIPTION

Figure 1C:
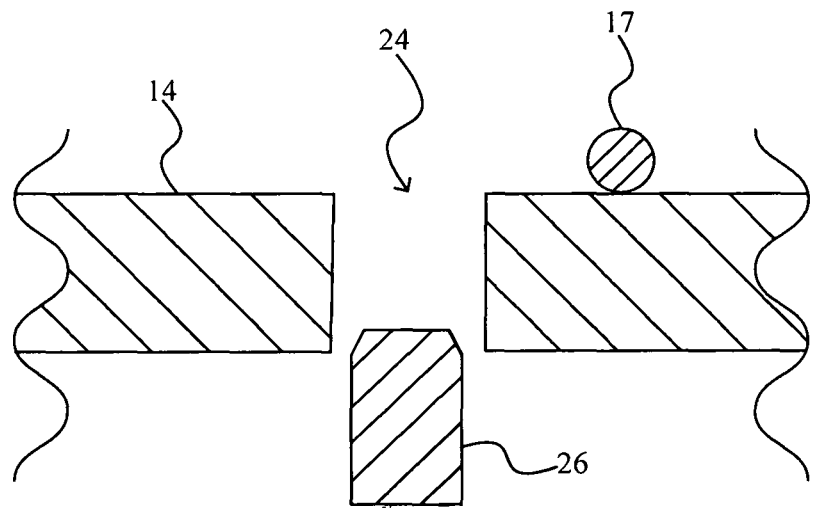
FIG. 1C is a schematic sectional view of an actuator pin and elastomeric seal on a support surface of a chuck assembly.

FIGS. 1A and 1B illustrate an example chuck assembly 10 supporting a wafer-level package assembly 12 on a planar support surface 14. The planar support surface 14 is bound by a side edge surface 16 extending generally perpendicular to the surface 14. As illustrated, the side edge surface 16 is a continuous edge such that the support surface 14 forms a stadium shape. The support surface 14 can form other shapes as desired, such as rectangle, rounded rectangle, circle, irregular and others. In addition, the support surface can be formed of various materials (e.g., metal) utilized in material handling systems.

In one embodiment, the surface 14 can include an elastomeric ring 17 (see FIGS. 1C and 1D) positioned thereon that can be used to create a vacuum seal between assembly 12 and surface 14. The chuck assembly 10 further includes a lower surface 18 and a pedestal 20. In one embodiment, the wafer-level package assembly 12 is a reconstituted wafer that includes a plurality of individual electronic devices (e.g., silicon dies) arranged within a molded material. Chuck assembly 10 can be used to assist in inspecting the wafer-level package assembly 12, for example using an inspection tool. Inspection of the wafer-level package assembly 12 can be performed prior to, during and/or after application of a redistribution layer (RDL) that is used to connect devices in the wafer-level package assembly 12.

Figure 1D:
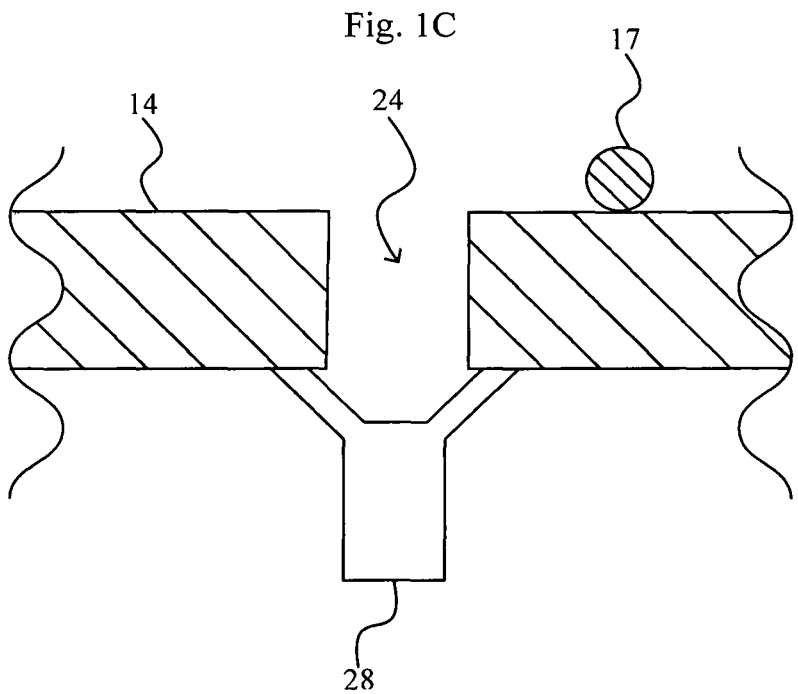
FIG. 1D is a schematic sectional view of a vacuum source and elastomeric seal on a support surface of a chuck assembly.

The pedestal 20 can be used to translate the chuck assembly 10 during inspection of the wafer-level package assembly 12. In addition, as shown in FIGS. 1C and 1D, the pedestal 20 can be configured to house various components. For example, the pedestal 20 can include one or more conduits 24 for operation of push pins 26 that actuate wafer-level package assembly 12 vertically with respect to the top surface 14. Alternatively, or in addition to, a vacuum source 28 can be coupled with a conduit 24 for applying negative pressure to a bottom surface of a package assembly 12 when the package assembly 12 is positioned on surface 14 and sealed against surface 14 with seal 17.

FIGS. 2A and 2B illustrate a material handling system 100 that utilizes chuck assembly 10 during inspection of wafer-level package assembly 12. In order to secure the wafer-level package assembly 12 to the chuck assembly 10 during an inspection process, system 100 includes a clamping mechanism 30. The clamping mechanism 30 includes a cover or collar 31 defining a central aperture 32 that exposes a top surface of the wafer-level package assembly 12 during inspection. As illustrated, the cover 31 and central aperture 32 are rectangular, although other shapes for cover 31 and/or central aperture 32 (e.g., square, circle, ellipse, stadium, irregular) can be used as desired.

In one embodiment related to a method of inspection, package 12 is positioned or loaded on surface 14. The elastomeric ring 17 creates a seal and a vacuum source 28 is used to urge the panel 12 toward the surface 14. Once vacuum pressure is applied, the clamping mechanism 30 is positioned over the wafer-level package 12 and top surface 14. In one embodiment, the clamping mechanism 30 can include an elastomeric ring (not shown) about the perimeter of aperture 32 to prevent damage to the package 12. One or more latch mechanisms 34 (schematically illustrated) can be used to extend around edge surface 16 and clamp on to lower surface 18 so as to apply pressure in order to secure the wafer-level package assembly 12 to the chuck assembly 10. Once the wafer-level package assembly 12 is secured, translation and/or inspection of the wafer-level package assembly 12 can be facilitated. In one example, an inspection tool 102 such as an optical system (e.g., a camera) or other device can be used to inspect the assembly 12.

The latch mechanisms 34 can take a variety of different forms and operate in different ways (e.g., rotationally, linearly) to secure clamping mechanism 30 to chuck assembly 10. In one embodiment, the latch mechanisms 34 form an 'L' shape as illustrated in FIG. 2B and are attached to the cover 31 with spring loaded hinges 36. In this embodiment, each latch mechanism 34 is adjustable from a first, open position, to a second, closed position. A top portion of the 'L' is attached to cover 31 through hinge 36, where the spring of the hinge 36 biases the latch mechanism to the closed position, where the lower portion of the 'L' engages the lower surface 18 of chuck assembly 10. In the open position, the lower portion of the 'L' is moved away from the lower surface 18 such that the clamping mechanism 30 can be removed from the chuck assembly 10 (e.g., by lifting the clamping mechanism vertically away from the chuck assembly 10).

Figure 2C:
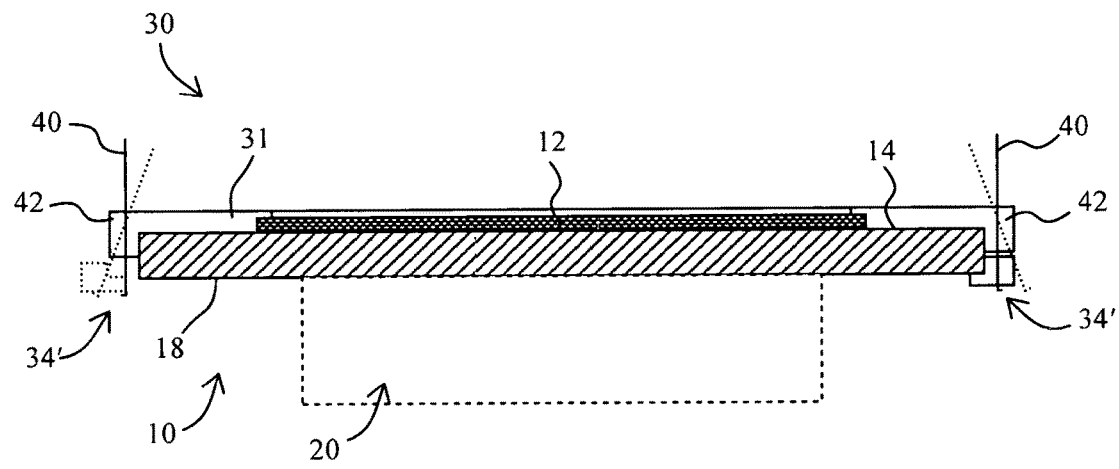
FIG. 2C is a schematic side view of an alternative latch mechanism in the material handling system of FIG. 2A.

Another latch mechanism 34' is illustrated in FIG. 2C, which is coupled with a shaft 40 that extends through a corresponding bore 42 in the cover 31. Latch mechanisms 34' are 'L' shaped, with an upper portion of the 'L' attached to the shaft 40 and a lower portion of the 'L' configured to engage the surface 18 in a closed position (as shown on the right side of FIG. 2C). In one embodiment, a locking mechanism (e.g., a nut, clamp or other apparatus) can be coupled with shaft 40 to secure latch mechanism 34' to the surface 18 and thus secure clamping mechanism 30 to chuck assembly 10. To disengage the latch mechanism 34' from the surface 18, shaft 40 can be adjusted such that the lower portion of the 'L' of the latch mechanism 34' is spaced from surface 18 (as shown on the left side of FIG. 2C). The shafts 40 can then be lifted vertically to release the clamping mechanism 30 from the chuck assembly 10 as the latch mechanisms 34' are disengaged from surface 18.

Figure 3:
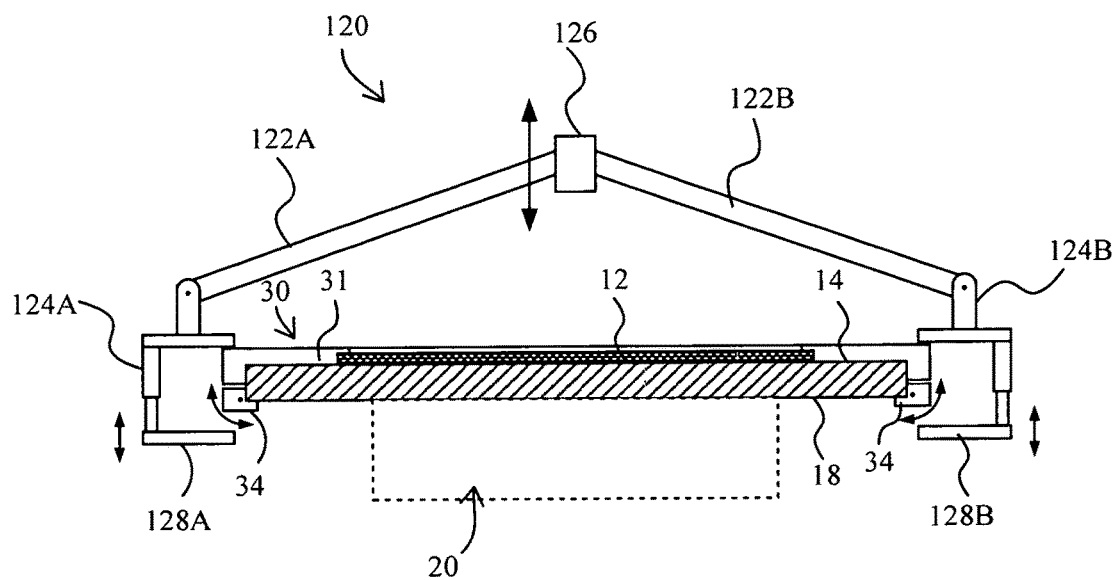
FIG. 3 is a schematic side view of a material handling system having a placement tool.

In the embodiment of FIG. 3, a placement mechanism or tool 120 can be used with material handling system 100. As illustrated, the mechanism 120 includes a first arm 122A terminating at a distal tool 124A (e.g., an end effector and robotic arm) and a second arm 122B terminating at a distal tool 124B. Each of the arms 122 are coupled with an actuator assembly 126 that operates to move the arms 122 and the distal tools 124. The actuator assembly 126 can be one or more hydraulic or pneumatic cylinders, in one embodiment. When tools 124 are in place, the actuator assembly 126 can actuate arms 128A and 128B to latch mechanisms 34 with respect to the arms 122A and 122B, respectively. In an open position, the arms 128A and 128B actuate latch mechanisms 34 in the open position. In this position, the placement mechanism can place the clamping mechanism 30 over the package assembly 12. In some embodiments, the placement mechanism further aligns the central aperture 32 with the package assembly 12 on the chuck assembly 10. When clamping mechanism 30 is in place, release of the arms 128 from the latch mechanisms 34 allow the spring loaded latch mechanisms 34 to return to the closed position where the latch mechanisms 34 engage surface 18.

After the latch mechanisms 34 secure package assembly 12 to the surface 14, placement mechanism 120 can retract and the assembly 12 can be addressed to an inspection tool to conduct inspection on the assembly 12. Once inspection is complete, the latch mechanism 34 can be released and the placement mechanism 120 can be moved into contact with the clamping mechanism 30. The placement mechanism 120 can retract the clamping mechanism 30 away from the assembly 12 and surface 14 so that the assembly 12 can be unloaded from the surface 14 for further processing.

Figure 4:
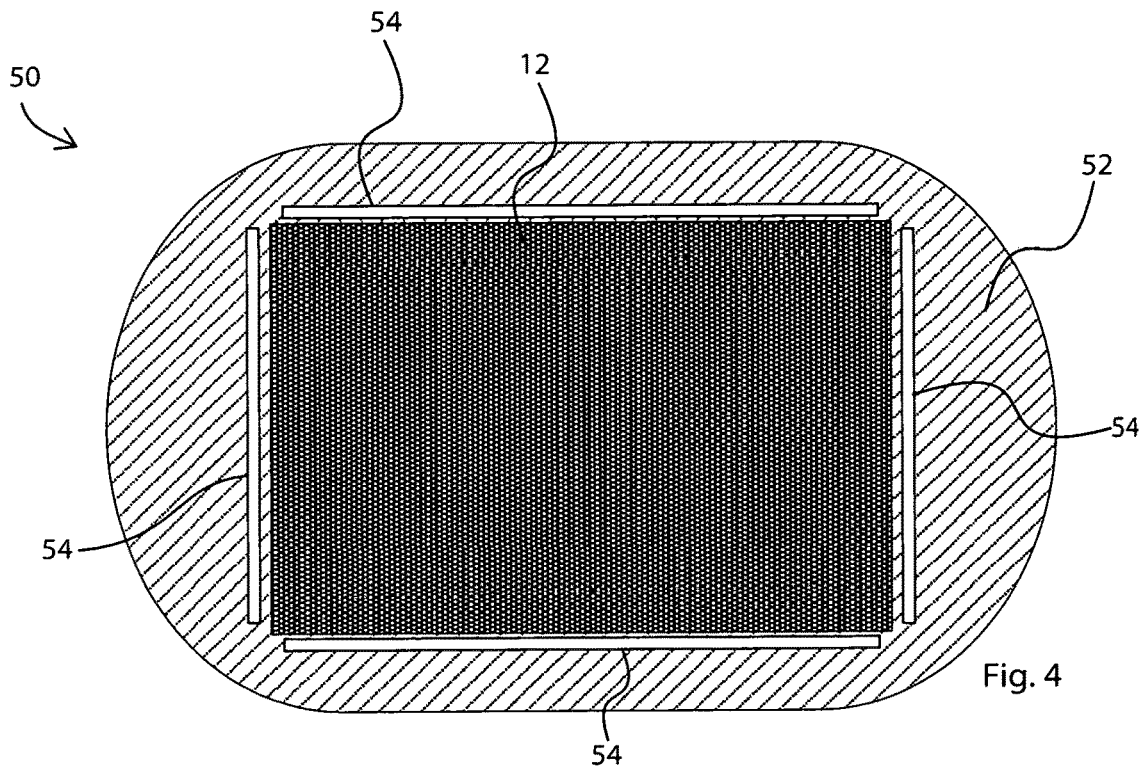
FIG. 4 is schematic top plan view of an alternative chuck assembly with a wafer-level package assembly supported thereon.

FIG. 4 is a schematic top plan view of an alternative chuck assembly 50 that includes a top surface 52 and can further be used with a placement mechanism 120 as discussed above. The chuck 50 further includes a plurality of gripping members 54 positioned around the wafer-level package assembly 12. The gripping members 54 can be transitioned from a first, recessed position to a second, gripping position in order to secure a wafer-level package assembly 12 to the chuck 50.

Figure 5:
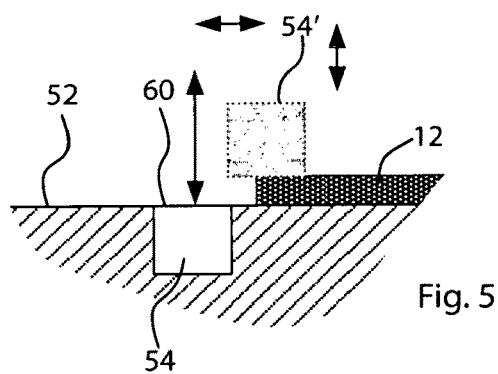
FIG. 5 is a schematic side view of a gripping member.

FIG. 5 illustrates a schematic side view of operation of gripping member 54. As illustrated, the gripping member 54 is recessed from top surface 52. In particular, a top surface 60 of the gripping member 54 can be co-planar with the top surface 52 and or recessed therefrom when the gripping member 54 is in the recessed position. In order to secure the wafer-level package assembly 12 to the chuck assembly 50, the gripping member 54 can be operated to a gripping position 54' in which the gripping member 54 applies pressure to the wafer-level package assembly 12 and subsequently secures the wafer-level package 12 to the chuck assembly 50. In one embodiment, movement of the gripping member 54 can be controlled using a pneumatic actuator.

Figure 6:
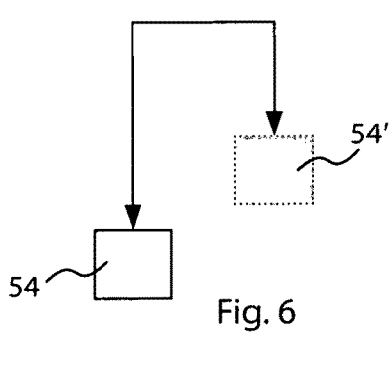
FIG. 6 is a schematic view showing a path of travel for a gripping member.
Figure 7:
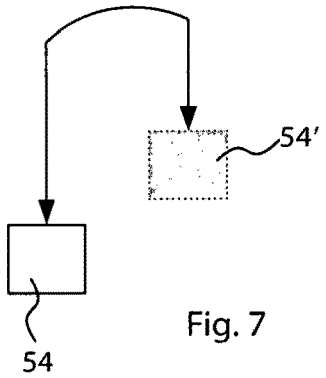
FIG. 7 is a schematic side view of a path of travel for a gripping member.

Operation of the gripping members 54 can move in a linear fashion such as that schematically illustrated in FIG. 6. In particular, transition of the gripping member 54 to the gripping position 54' involves a vertical movement, a horizontal movement, and another vertical movement. Alternatively, as illustrated in FIG. 7, the gripping member 54 can define a vertical movement, a curvilinear movement, and another vertical movement to secure wafer-level package assembly 12 to chuck assembly 50.

Various embodiments of the invention have been described above for purposes of illustrating the details thereof and to enable one of ordinary skill in the art to make and use the invention. The details and features of the disclosed embodiment[s] are not intended to be limiting, as many variations and modifications will be readily apparent to those of skill in the art. Accordingly, the scope of the present disclosure is intended to be interpreted broadly and to include all variations and modifications coming within the scope and spirit of the appended claims and their legal equivalents.

What is claimed is:

1. A wafer-level package handling system, comprising:
a chuck assembly defining an upper surface configured to support a wafer-level package assembly;
a clamping mechanism securing the wafer-level package assembly to the upper surface, wherein the clamping mechanism includes a cover having a central aperture that exposes a top surface of the wafer-level package assembly, and a latch mechanism extending around a side edge of the chuck assembly to apply pressure from a lower surface of the chuck assembly in order to secure the wafer-level package assembly to the chuck assembly.

2. The handling system of claim 1, wherein the central opening is aligned with the wafer-level package assembly.

3. The handling system of claim 1, the latch mechanism applies pressure between the clamping mechanism and the wafer-level package assembly.

4. The handling system of claim 1, wherein the latch mechanism is spring loaded.

5. The handling system of claim 1, wherein the upper surface includes an elastomeric ring configured to create a seal between the clamping mechanism and the upper surface and a vacuum to apply pressure to the wafer-level package assembly toward the upper surface.

6. The handling system of claim 1, further comprising an optical system used to inspect the wafer-level package assembly.

7. The handling system of claim 1, further comprising a placement mechanism configured to position the clamping mechanism relative to the wafer-level package assembly.

8. The handling system of claim 7, further comprising an actuator configured to operate a latch mechanism to secure the clamping mechanism to the chuck assembly.

9. A method of handling a package assembly of a semiconductor device, comprising:
loading the package assembly on a surface of a chuck assembly;
positioning a cover over the package assembly, wherein the cover has a central aperture that exposes a top surface of the package assembly;
applying pressure to the cover to secure the package assembly to the surface, wherein applying pressure includes operating a latching mechanism around an edge of the chuck assembly to apply pressure from a lower surface of the chuck assembly in order to secure the wafer-level package assembly to the chuck assembly; and
inspecting the package assembly.

10. The method of claim 9, further comprising:
aligning an aperture of the cover with the package assembly.

11. The method of claim 9, further comprising:
operating a placement mechanism to position the cover with respect to the package assembly.

12. The method of claim 11, further comprising:
using an arm of the placement mechanism to operate the latching mechanism.

13. The method of claim 11, further comprising:
operating the placement mechanism to remove the cover from the chuck assembly.

14. The method of claim 9, further comprising:
loading a second package assembly onto the chuck assembly;
operating the placement mechanism to position the cover with respect to the second package assembly; and
applying pressure to the cover to secure the second package assembly to the chuck assembly.

15. The method of claim 9, wherein the latching mechanism is spring loaded.

16. The method of claim 9, wherein the latching mechanism extends through a bore in the cover, the latching mechanism including a finger operable from a first position in which the finger engages the chuck assembly to secure the cover to the chuck assembly to a second position in which the finger engages the cover to lift the cover relative to the chuck assembly.

17. The method of claim 9, further comprising:
using an optical system to inspect the package assembly.

18. The method of claim 17, further comprising:
moving the chuck assembly relative to the optical system.

19. A wafer-level package assembly formed according to the method of claim 9.

* * * * *